United States Patent
Liao (12)

(10) Patent No.: US 6,735,072 B2
(45) Date of Patent: May 11, 2004

(54) ON-CHIP DECOUPLING CAPACITORS DESIGNED FOR A 0.11 MICRON AND BEYOND DUAL GATE OXIDE CMOS TECHNOLOGY

(75) Inventor: Hongmei Liao, Littleton, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 95 days.

(21) Appl. No.: 10/121,891

(22) Filed: Apr. 12, 2002

(65) Prior Publication Data

US 2003/0193771 A1 Oct. 16, 2003

(51) Int. Cl.[7] .............................................. H01G 4/228
(52) U.S. Cl. ........................ 361/306.2; 361/306.1; 361/301.2; 361/321.4; 361/313; 438/199; 438/210; 257/295; 257/296

(58) Field of Search ..................... 361/306.2, 306.1, 361/306.3, 301.2, 321.4, 311–313, 320, 328; 438/199, 210, 329; 257/295, 296, 532–535

(56) References Cited

U.S. PATENT DOCUMENTS

| | | | | |
|---|---|---|---|---|
| 5,739,998 A | * | 4/1998 | Wada ........................... 361/56 |
| 5,753,947 A | * | 5/1998 | Gonzalez ..................... 257/296 |
| 6,608,365 B1 | * | 8/2003 | Li et al. ....................... 257/532 |
| 2003/0072126 A1 | * | 4/2003 | Bhattacharyya ............. 361/311 |

* cited by examiner

*Primary Examiner*—Anthony Dinkins
*Assistant Examiner*—Nguyen T. Ha
(74) *Attorney, Agent, or Firm*—Lahive & Cockfield, LLP

(57) ABSTRACT

A decoupling capacitor suitable for use with 0.11 micron or less, for example 0.09 micron, CMOS technology is provided herein. The decoupling capacitor includes a decoupling structure that minimizes leakage current associated with the decoupling capacitor.

9 Claims, 3 Drawing Sheets

ON-CHIP DECOUPLING CAPACITORS DESIGNED FOR A 0.11 MICRON AND BEYOND DUAL GATE OXIDE CMOS TECHNOLOGY

TECHNICAL FIELD OF THE INVENTION

The present invention generally relates to an integrated circuit, and more particularly, to a decoupling capacitor for use in an integrated circuit.

BACKGROUND OF THE INVENTION

The extremely rapid switching rates of the discrete components that make up integrated circuits typically cause current transients in the power buses of the integrated circuits. These current transients may last for several nanoseconds. Unfortunately, for a given integrated circuit, the typical power supply driving the power bus requires an order of magnitude in the microsecond range to compensate for the current transients injected on the power bus by the discrete components. Moreover, the reduction in gate threshold voltage of the various discrete components in the integrated circuit requires the power bus to deliver a stable voltage signal having a minimum of voltage level variation. Consequently, power bus stability, in terms of current response and voltage level fluctuation, is a significant issue in the design of an integrated circuit.

The conventional approach to provide power bus stability is the insertion of decoupling capacitors between the power bus and the one or more discrete components. However, the technical evolution of these discrete components has continued to realize a downwards scale to achieve density, speed and power improvements in the art of integrated circuit technology. With the development of new integrated circuit technologies and structures, the discrete devices forming the integrated circuit often have submicron structural dimensions. For example, in the field of metal oxide semiconductor field effect transistors (MOSFETs) the structure and design of MOSFET's continue to realize an ever shorter channel length between the source region and drain region of the MOSFET. The result of the trend toward ever shorter channel lengths yields a device that is easier to switch. Nevertheless, the gate oxide thickness of the device is merely a few layers of atoms and is approaching fundamental limits. For example, in a 0.11 micron complimentary metal-oxide-semiconductor (CMOS) device, the gate oxide electrical thickness is often less than two nanometers. Consequently, the reduced gate oxide thickness of a 0.04 micron CMOS short channel device makes the device prone to the effects of gate leakage current from other devices coupled thereto. One example is gate tunneling leakage current generated by one or more decoupling capacitors that couple the device to the power bus.

Although the decoupling capacitor plays a significant role in providing power bus stability, it is also a significant contributor of gate leakage current in the integrated circuit, which, in turn, contributes to an increased channel charge in the 0.11 micron device. Consequently, the increased channel charge in the 0.11 micron device diminishes the control that the device's gate and body terminals have on the channel.

Decoupling capacitor leakage current is attributable to the thin gate oxide thickness of the decoupling capacitor, that is, a gate oxide electrical thickness of two nanometers or less. Although the leakage current associated with decoupling capacitors is burdensome, it is undesirable to increase the gate oxide thickness of the 0.11 micron CMOS device so as to increase the gate threshold voltage ($V_T$) of the device to lower the portion of the channel charge contributed by the source body and drain body of the device because, the increase in the gate oxide thickness allows for an increase in electrostatic effects on $V_T$ and significantly slows switching speed of the device.

SUMMARY OF THE INVENTION

The present invention addresses the above-described limitations of a decoupling capacitor having a gate oxide layer electrical thickness of two nanometers or less. The present invention provides an approach to enable the use of a metal-oxide-silicon (MOS) capacitor having a leakage current value suitable for use with 0.11 micron CMOS technology and with CMOS technology beyond 0.11 microns, for example 0.09 micron technology.

In one embodiment of the present invention, a decoupling capacitor having a transistor gate leakage current suitable for use with one or more MOSFET's having a channel length of about 0.04 microns or less is provided. The decoupling capacitor includes a gate oxide region of sufficient thickness to yield an average off state leakage current ($I_{OFF}$) between drain and source ($I_{DS}$) of the capacitor of about 0.1 nA/$\mu$m or less. The decoupling capacitor is also capable of providing an $I_{OFF}$ leakage current between the drain and gate ($I_{DG}$) of about 0.02 nA/$\mu$m, or less.

The above described approach benefits an integrated circuit that utilizes 0.11 micron CMOS technology so that the detrimental effects of leakage current previously contributed by one or more decoupling capacitors is significantly abated. As such, devices subject to more stringent leakage current requirements, for example, dynamic memory devices, can benefit from the 0.11 micron CMOS technology while maintaining stringent leakage current requirements.

In accordance with another aspect of the present invention, a method is performed in an integrated circuit comprising one or more CMOS devices having a channel length of about 0.04 microns or less to minimize leakage current from a decoupling capacitor coupled between the one or more CMOS devices and a power bus of the integrated circuit. By increasing a gate oxide layer thickness of the decoupling capacitor, gate tunneling current associated with the decoupling capacitor is minimized. Having increased the gate oxide layer thickness of the decoupling capacitor, the method then provides the steps of coupling a gate element of the decoupling capacitor to a voltage node capable of supplying a supply voltage value of about $V_{DD}$. The method also provides the steps of coupling a source element of the decoupling capacitor to a voltage node or voltage source having a voltage potential of zero volts or less and coupling a drain element of the decoupling capacitor to a voltage node or voltage source having a voltage potential of about zero volts or less.

The above described approach benefits a microprocessor architecture that utilizes CMOS devices having a channel length of about 0.04 microns or less. Because of the increased thickness of the decoupling capacitors gate oxide region, the detrimental effects of leakage current from the capacitor on the CMOS devices are minimized and in some instances eliminated. As such, noise immunity of dynamic logic circuits within the microprocessor is not degraded and in fact is possibly enhanced.

In a further aspect of the present invention, an integrated circuit is provided having a 0.11 micron CMOS device and a decoupling capacitor coupled between the CMOS device and a power bus of the integrated circuit. The decoupling capacitor having a thick gate oxide region to minimize leakage current in the decoupling capacitor. The thick gate oxide region of the decoupling capacitor has an oxide electrical thickness of between about 2.7 nanometers and about 3.3 nanometers.

The above described approach allows an integrated circuit that utilizes 0.11 micron CMOS devices to avoid the effects of leakage current associated with one or more decoupling capacitors in either their on-state or off-state and thus avoid an increase in leakage power consumption of the integrated circuit. As such, overall power consumption of the integrated circuit is reduced, which, in turn, provides an integrated circuit having an improved thermal profile.

In yet another aspect of the present invention, a method is practiced in a microprocessor having one or more 0.11 micron CMOS devices for reducing leakage power in the microprocessor. The method includes the steps of inserting one or more decoupling capacitors having a thick gate oxide region into one or more decoupling capacitor locations in the microprocessor and coupling each of the inserted decoupling capacitors between a power bus of the microprocessor and the one or more 0.11 micron CMOS devices. The insertion of the decoupling capacitors having the thick gate oxide region provides the microprocessor with the capability to realize the reduced leakage power.

As a consequence of the above described approach, the leakage current associated with the coupling capacitors is minimized so that the stability and reliability of synchronous random access memory (SRAM) cells within the microprocessor are not compromised.

BRIEF DESCRIPTION OF THE DRAWINGS

An illustrative embodiment of the present invention will be described below relative to the following drawings.

DETAILED DESCRIPTION

The illustrative embodiment of the present invention provides a decoupling capacitor having a thick gate oxide region to minimize and possibly avoid gate leakage current (for example, sub-threshold leakage current ($I_{OFF}$) or other like leakage current components such as gate tunneling current, associated with the decoupling capacitor). In the illustrative embodiment, the decoupling capacitor is a long channel MOS device having a gate oxide region electrical thickness of between about 2.7 nanometers and about 3.3 nanometers. Those skilled in the art will recognize that the decoupling capacitor of the illustrative embodiment can also be structured as a short channel MOS device.

In the illustrative embodiment, the decoupling capacitor is attractive for use in integrated circuits that utilize 0.11 micron or less, for example, 0.09 microns CMOS dual gate technology. The decoupling capacitor in the illustrative embodiment allows an integrated circuit, such as a microprocessor, to utilize 0.11 micron CMOS technology devices in circuits that require a high degree of stability, speed and reliability, (such as memory cells that have stringent leakage current requirements). The illustrative embodiment provides a significant reduction in leakage current in an integrated circuit and as such, allows an integrated circuit designer to avoid functional problems commonly associated with transistor leakage current. For example, the illustrative embodiment avoids a degradation of noise immunity in dynamic logic circuits, the compromise of stability in six transistor SRAM cells and the increase in leakage power consumption of the integrated circuit.

Figure 1:
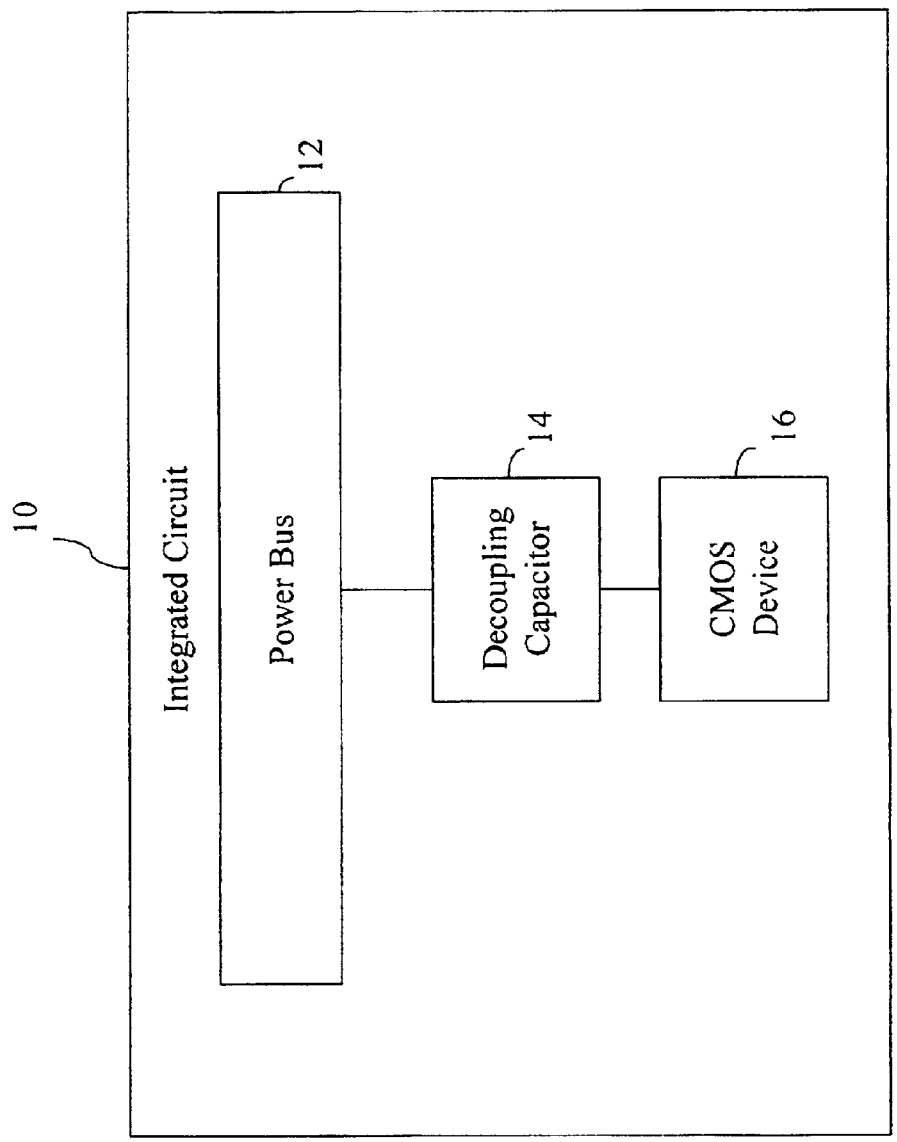
FIG. 1 depicts a block diagram of an exemplary integrated circuit suitable for practicing the illustrative embodiment of the present invention.

FIG. 1 is a block diagram of an exemplary integrated circuit 10 that is suitable for practicing the illustrative embodiment of the present invention. The exemplary integrated circuit 10 includes a power bus 12 that distributes the power supply voltage $V_{DD}$ to the various circuits within the exemplary integrated circuit 10. Coupled to the power bus 12 is a decoupling capacitor 14, which, in turn, is coupled to a CMOS device 16. The decoupling capacitor 14, provides the CMOS device 16 with a stable voltage level $V_{DD}$ that is substantially free of voltage variation and also provides the CMOS device 16 with a minimum value of gate leakage current when the decoupling capacitor is in an on-state or an off-state. In the illustrative capacitor depicted in FIG. 1, the CMOS device 16 is a CMOS device with a channel length of about 0.04 micron. Because of the short channel effect of the CMOS device with a channel length of about 0.04 micron and its corresponding thin gate oxide layer, the 0.04 micron device is susceptible to leakage current associated with leaky decoupling capacitors coupled between the power bus 12 and the CMOS device 16. Those skilled in the art will appreciate that the decoupling capacitor 14 is able to provide significant improvements in various transistor leakage current components, such as transistor sub-threshold leakage current, gate induced drain leakage current, gate oxide tunneling current and other like transistor leakage current components.

Figure 2:
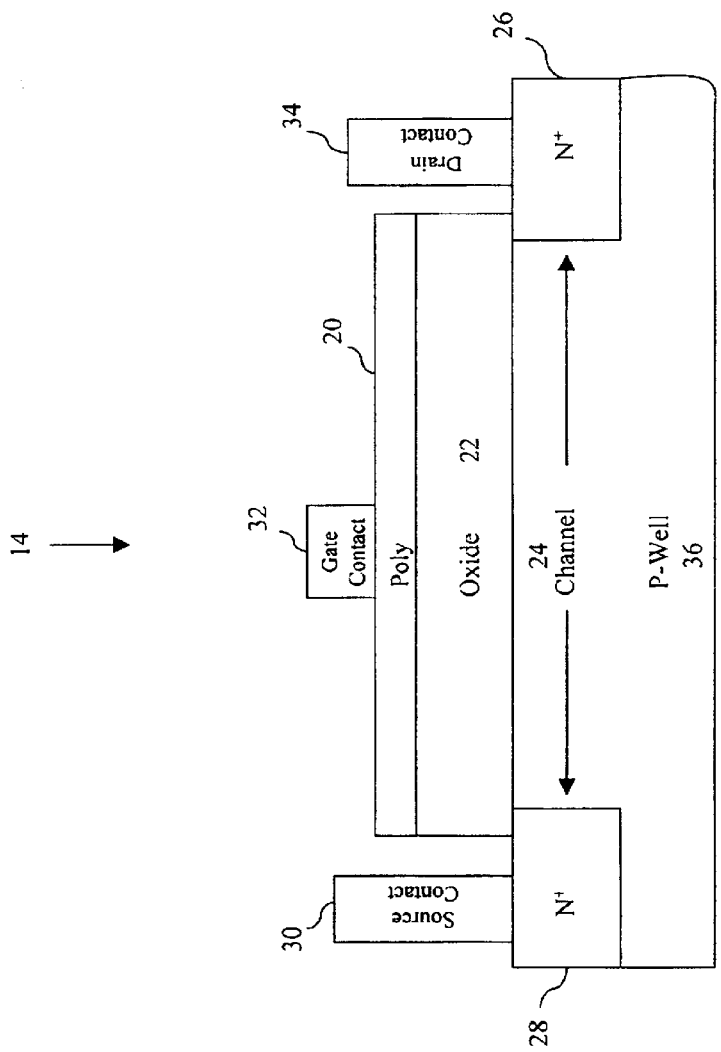
FIG. 2 depicts schematic representation of a decoupling capacitor suitable for practicing the illustrative embodiment of the present invention.

FIG. 2 illustrates the decoupling capacitor 14 in more detail. The decoupling capacitor 14 includes an $N^+$ source region 28, an $N^+$ drain region 26 and a channel region 24. The decoupling capacitor 14 is configured as and behaves as, a long channel MOSFET. The decoupling capacitor 14 also includes a polysilicon gate region 20 formed over a gate oxide region 22, which is formed over a portion of a P-well region 36. A metalized source contact 30 is formed over a portion of the $N^+$ drain region 26, while a metalized drain contact 34 is formed over a portion of the $N^+$ drain region 36. A metalized gate contact 32 is formed over a portion of the polysilicon gate region 20. Those skilled in the art will recognize that the gate oxide region 22 can extend to contact a surface the $N^+$ source region 28 and a surface of the $N^+$ drain region 26. For the ease of discussion, an illustrative N-type MOS capacitor is exemplified and is not meant to be limiting of the present invention. Those skilled in the art will recognize that the inventive concepts embodied herein are also applicable to a MOS capacitor structured as a P-type MOS capacitor.

During fabrication of the decoupling capacitor 14, the gate oxide region 22 is formed to an electrical thickness of between about 2.7 nanometers and 3.3 nanometers. As such, the gate oxide region 22 of the decoupling capacitor 14 is considered a thick oxide gate region. As a consequence of the thick gate oxide region 22, the decoupling capacitor 14 exhibits a leakage current value $I_{OFF}$ of about 0.1 nA/$\mu$m or less between its drain and source, and an $I_{OFF}$ value of about 0.02 nA/$\mu$m or less between its drain and gate. Moreover the thick gate oxide region 22 acts to suppress gate leakage current attributable to gate tunneling current when the decoupling capacitor 14 is in an on-state.

In operation, the decoupling capacitor 14 is configured so as the source contact 30 and the drain contact 34 are coupled to a first power grid or bus and the gate contact 32 is connected to a second power grid or bus in the exemplary integrated circuit 10. In the illustrative embodiment of the present invention, the gate contact 32 is coupled to the power bus or grid supplying $V_{DD}$ and the source contact 30 along with the drain contact 34 are coupled to the power bus or grid supplying $V_{SS}$. Moreover, those skilled in the art will recognize that in operation, it is possible to place a fuse or shut-off transistor in series with the decoupling capacitor 14 to allow the decoupling capacitor 14 to recover from a gate oxide breakdown in the decoupling structure. Because of the thick gate oxide layer 22 in the decoupling structure, the decoupling capacitor 14 is able to realize a sub-threshold leakage current $I_{OFF}$ of about 0.1 nA/$\mu$m between its source and drain and a sub-threshold leakage current $I_{OFF}$ of about 0.02 nA/$\mu$m between its gate and drain when the decoupling capacitor is in an off-state. Moreover, the decoupling capacitor 14 exhibits an oxide capacitance per unit area ($C_{OX}$) value of about 10.8 fF/$\mu$m$^2$. As a result, architects and designers of high performance microprocessors are able to implement 0.11 micron CMOS devices throughout the various microprocessor circuits, for example, circuits located at the core of the microprocessor, such as the microprocessor's various memory cells.

Figure 3:
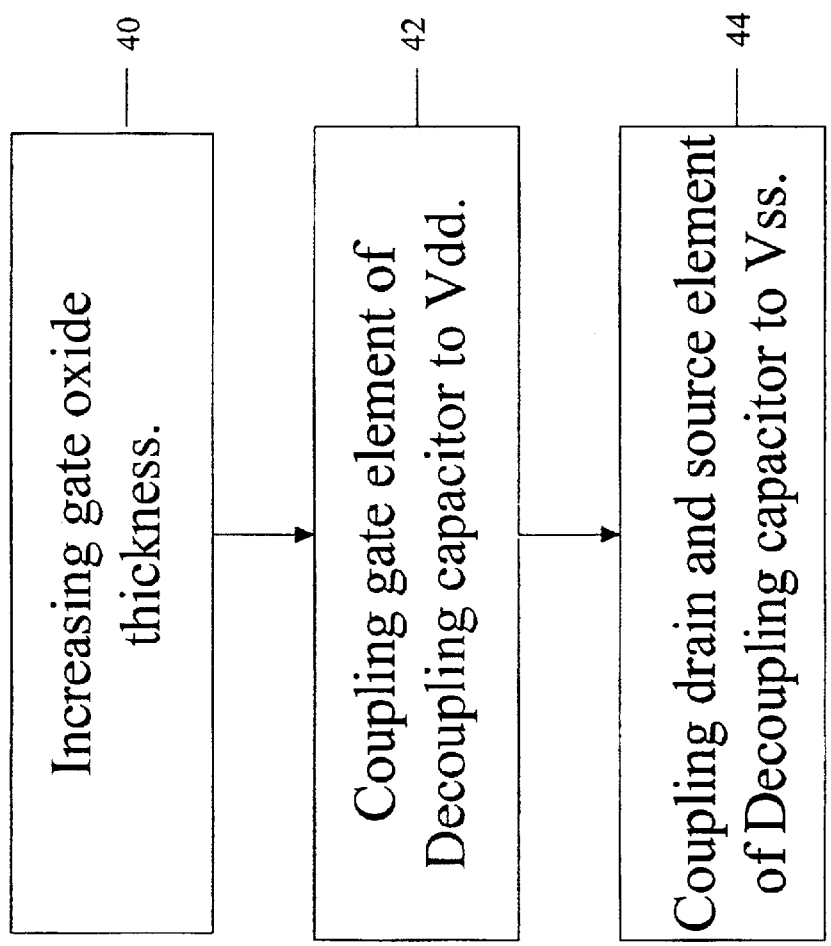
FIG. 3 is a flow diagram depicting steps taken to practice an illustrative embodiment of the present invention.

FIG. 3 illustrates the steps taken to reduce leakage power in the exemplary integrated circuit 10. A suitable exemplary integrated circuit 10 can be a microprocessor that utilizes 0.11 micron CMOS technology. To reduce the leakage power in the exemplary integrated circuit 10 and abate the detrimental effects of leakage current contributed by the decoupling device 14, the gate oxide thickness of the decoupling structure is increased to an electrical thickness of about 2.7 nanometers to about 3.3 nanometers (step 40). Having increased the gate oxide thickness of the decoupling structure to a thickness suitable for minimizing transistor leakage current in the decoupling capacitor 14, the decoupling capacitor 14 is ready for placement in the exemplary integrated circuit 10 to reduce leakage power consumption of the exemplary integrated circuit 10.

Upon insertion of the decoupling capacitor 14, the gate element is coupled to a first power bus, typically the bus supplying $V_{DD}$, which is typically between 1.1 volts and 5 volts (Step 42). In like fashion, the drain and source element of the decoupling capacitor 14 are coupled to a second power bus, typically the bus supplying $V_{SS}$, which is typically at a voltage potential of about 0.0 volts or less (Step 40). Because the decoupling capacitor 14 is biased so that the gate voltage exceeds the threshold voltage ($V_T$) of the decoupling capacitor structure, the decoupling capacitor 14 is considered in inversion so that there exists in addition to a depletion layer charge, a negatively charged inversion layer at the oxide semiconductor interface. Those skilled in the art will also recognize that the decoupling capacitor 14 can be biased so that the decoupling capacitor 14 is characterized as in accumulation or in depletion.

While the present invention has been described with reference to a preferred embodiment thereof, one skilled in the art will appreciate that various changes in form and detail may be made without departing from the intended scope of the present as defined in the pending claims. The voltage level of the voltage bus identified as $V_{DD}$ refers to a bus, node or source capable of supplying voltage levels in the range of 1.1 to 5.0 volts while the reference to the voltage bus identified as $V_{SS}$ refers to a bus, node or source supplying a voltage level of about zero volts or less.

What is claimed is:

1. A capacitor having a transistor gate leakage current suitable for use as a decoupling capacitor in an integrated circuit, the capacitor comprising:

a gate oxide region of sufficient thickness to yield an average transistor sub-threshold leakage current ($I_{OFF}$) value of about 0.1 nA/$\mu$m or less as measured between a drain region and a source region of the capacitor when the capacitor is in an off-state.

2. The decoupling capacitor of claim 1, wherein the gate oxide region comprises silicon oxide.

3. The decoupling capacitor of claim 1, wherein the gate oxide region comprises a derivative of silicon oxide including nitrized silicon oxide.

4. The decoupling capacitor of claim 1 further comprising, a gate oxide capacitance per unit area of about 10.8 fF/$\mu$m$^2$.

5. The decoupling capacitor of claim 1, wherein the gate oxide region yields a transistor gate oxide leakage current ($I_{OX}$) of about 0.01 nA/$\mu$m or less when the capacitor is in the on-state.

6. The decoupling capacitor of claim 1, wherein the decoupling capacitor is suitable for use with one or more metal-oxide-semiconductor field-effect transistors (MOSFETs) having a channel length of about 0.04 microns or less.

7. The decoupling capacitor of claim 6, wherein the one or more MOSFETs comprises one or more complementary metal-oxide-silicon (CMOS) devices.

8. The decoupling capacitor of claim 1, wherein the capacitor is capable of limiting drain to gate current ($I_{DG}$) therein to about 0.02 nA/$\mu$m when the decoupling capacitor is in an off-state.

9. The decoupling capacitor of claim 1, further comprising, a source contact and a drain contact coupled to a node having a voltage potential of about zero volts or less.

* * * * *